United States Patent
Chen et al.

(10) Patent No.: US 7,596,772 B2
(45) Date of Patent: Sep. 29, 2009

(54) METHODOLOGY AND SYSTEM FOR SETUP/HOLD TIME CHARACTERIZATION OF ANALOG IP

(75) Inventors: Hanping Chen, Taoyuan County (TW); Chih-Yang Peng, Taoyuan County (TW); Alvin Hsin-Hung Chen, Kaohsiung (TW); Jia-Jio Huang, Hsinchu (TW); Jim Jyh-Herng Wang, Hsinchu County (TW); Kun-Cheng Wu, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 280 days.

(21) Appl. No.: 11/608,248

(22) Filed: Dec. 8, 2006

(65) Prior Publication Data
US 2008/0141198 A1    Jun. 12, 2008

(51) Int. Cl.
*G06F 17/50* (2006.01)
*G06F 9/45* (2006.01)
(52) U.S. Cl. .................. 716/6; 716/1; 716/5; 716/7; 716/18; 703/13; 703/14
(58) Field of Classification Search ............ 716/1, 716/4–7, 18; 703/13–22
See application file for complete search history.

(56) References Cited

U.S. PATENT DOCUMENTS

| | | | |
|---|---|---|---|
| 5,872,717 A * | 2/1999 | Yu et al. ................ | 716/6 |
| 6,223,333 B1 * | 4/2001 | Kuribayashi et al. ....... | 716/12 |
| 6,311,148 B1 | 10/2001 | Krishnamoorthy | |
| 6,363,516 B1 * | 3/2002 | Cano et al. ............... | 716/5 |

OTHER PUBLICATIONS

"Setup/Hold Time for Analog IPs", Peter H. Chen, Peter Pong, K.C. Wu, YW Chen, Alvin Chen, YC Chu, JJ Huang, and Jim Wang, Faraday Technology Corp, Snug Taiwan 2006.
"A Fast Methodology for Setup/Hold Time Characteristic for Analog IP", Peter H Chen, Peter Pong, KC Wu, YW Chen, Alvin Chen, YC Chu, JJ Huang, Jim Wang, Faraday Technology Corp, Snug Taiwan 2006. [http://www.snug-universal.org/cgi-bin/search/search.cgi?Taiwan,+2006].

* cited by examiner

*Primary Examiner*—Jack Chiang
*Assistant Examiner*—Nghia M Doan
(74) *Attorney, Agent, or Firm*—Winston Hsu

(57) ABSTRACT

A fast methodology and system to characterize setup/hold time for analog IPs are provided. Partial circuits of clock and data paths are simulated instead of the simulation of entire IPs. The partial circuits include all those paths of clock pin and data input pins before reaching first level DFF. This methodology includes multi-path searching of hierarchical SPICE netlist for the path of clock pin and data pins, so as to reduce the circuit subset, merge the paths of clock pin and the data pins, and characterize the setup/hold time for the analog IP. The paths of data pins and clock pin before DFF are used for setup/hold time characterization.

13 Claims, 9 Drawing Sheets

METHODOLOGY AND SYSTEM FOR SETUP/HOLD TIME CHARACTERIZATION OF ANALOG IP

BACKGROUND OF THE INVENTION

1. Field of Invention

The present invention relates to a fast methodology and a system for automatically characterizing the setup/hold time for analog IPs based on partial path extraction.

2. Description of Related Art

When given an IP, the IP user would like to have the timing constraint before reaching the first level of DFF (D flip-flop), i.e., the earliest (setup time) and latest (hold time) signal arrival requirement while the timing constraint from the second or deeper levels of DFF is of no concern.

FIG. 1 shows the input pins and a clock pin to the various levels of DFF for an analog IP. Incorrect setup/hold time may cause problems of data synchronization. Besides, characterizing the setup/hold time for entire IPs is inefficient. It takes days/weeks/months to run entire IP characterization.

It needs a generic methodology and system to simplify the input parameter setup while cutting the run time.

SUMMARY OF THE INVENTION

One of the aspects of the invention is to provide a generic methodology and system for automatically characterizing the setup/hold time for analog IPs to replace the manual guessing.

For the above and other aspects, a method for setup/hold time characterization is provided. The method comprises: inputting parameters; extracting critical paths for setup/hold time simulation; building SCSS and automatically recognizing analog gates, ESD protection structures and non-leaf nodes from hierarchical netlist; merging the extracted critical paths and the SCSS; generating and running setup/hold time testbench; and generating liberty libraries.

Moreover, another method for setup/hold time characterization is provided. The method comprises: performing an automatic macro recognition; performing a path search and extraction in a hierarchical netlist and a flatten netlist; building a SCSS; merging the searched and extracted paths and the SCSS; attaching post-simulation parasitic capacitors from the flatten netlist to the hierarchical netlist; tying logic high or low if the extracted path contains a floating net; and determining analog timing path based on logic states of the analog gates.

Still further, a system for setup/hold time characterization for an analog IP including flip-flops of at least first and second levels is provided. The system includes: an input module, for receiving inputting parameters; a path extraction module, extracting critical paths for setup/hold time simulation; a building module, building a subcircuit subset (SCSS); a merge module, merging the extracted critical paths and the SCSS; a testbench generation and running module, generating setup/hold time testbench and parallel running SPICE testbench; and a library generation module, generating liberty libraries.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
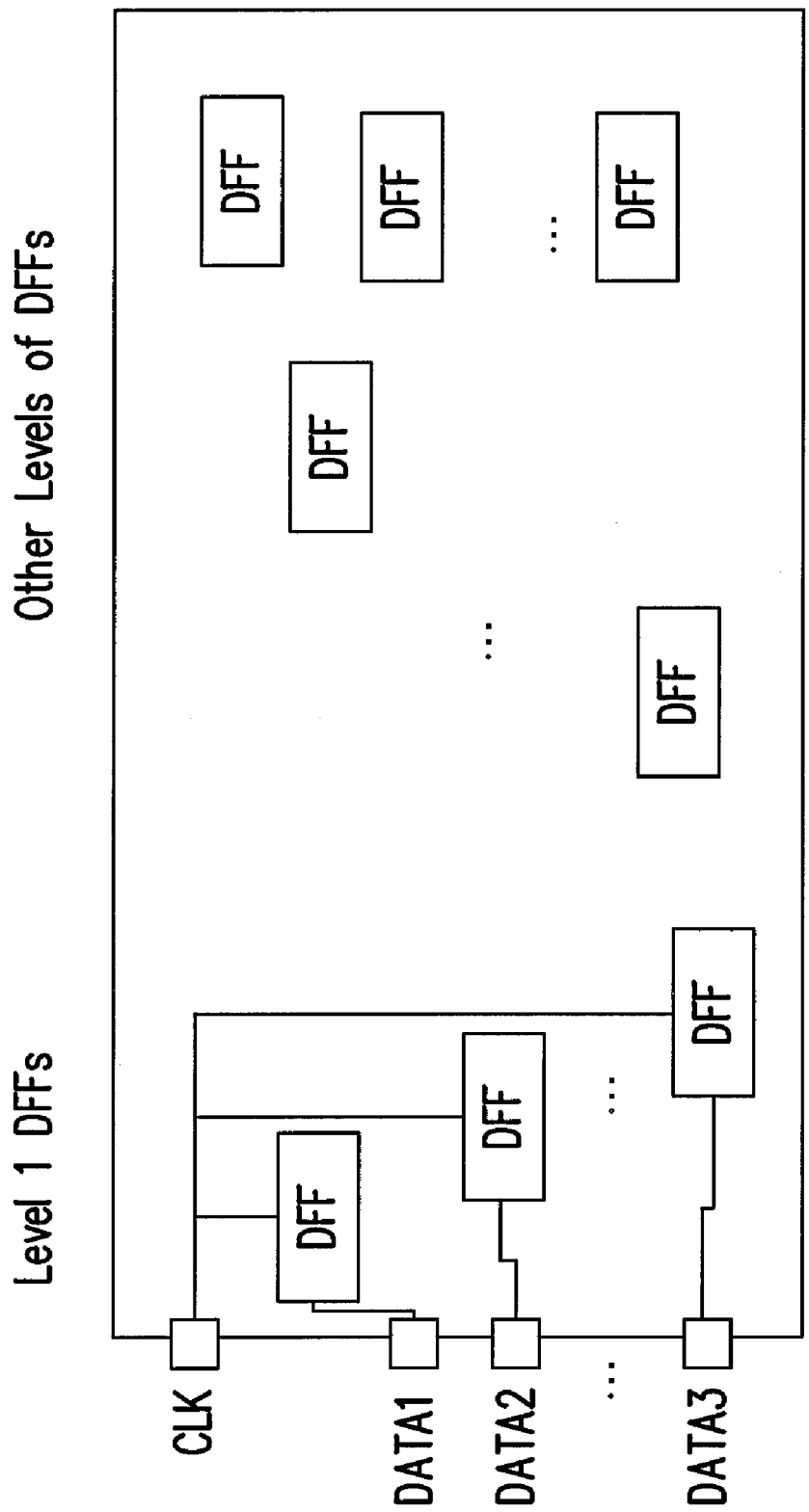
FIG. 1 shows input clock and data pins to various levels of DFF for an analog IP.

Reference will now be made in detail to the present preferred embodiments of the invention, examples of which are illustrated in the accompanying drawings. Wherever possible, the same reference numbers are used in the drawings and the description to refer to the same or like parts.

Figure 2:
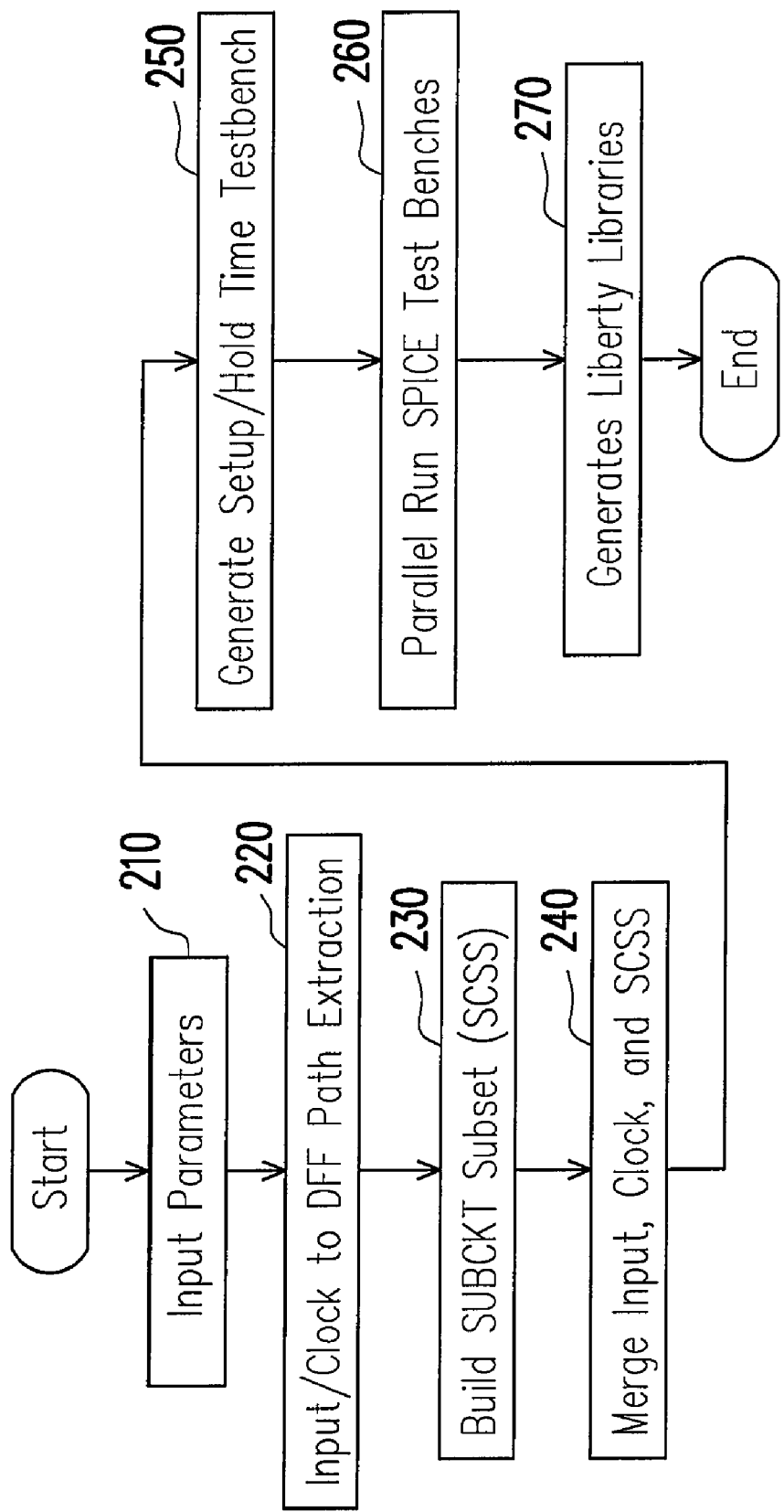
FIG. 2 shows a flow of Setup/Hold time characterization according to an embodiment of the invention.

In order to speed up the netlist processing, a methodology according to an embodiment of the present invention uses the hierarchical netlist instead of the flattened netlist for reducing the code size. Path searching includes single path searching and multi-path searching. The multi-path searching is expanded by pushing unfinished netlist to stack during search. After each single/multiple path for data pins and clock pin is found, the clock pin and the corresponding data pins have to be merged. Circuits along the merged paths are extracted from the circuits of the entire IPs. The merged paths may have to match the subset of the Subset Circuit. FIG. 2 shows a setup/hold time characterization flow for analog IPs. In Step 210, parameters are input. The parameters may include, for example, but not limited by, input pins: R0-R9, G0-G9 and B0-B9; clock pin: CK and destination block: DFF.

In Step 220, signal paths of input data and/or clock signal to DFF are extracted. For path extraction, the SPICE hierarchical netlist is built. The SUBCKT or Macro is classified into several categories: Analog Macro (or Analog Gate); ESD/Antenna Macro and XMacro call or NLXM (Non-Leaf XInstance Macro) call.

Analog Macros or Analog Gates are leaf nodes in SPICE code. These gates contain MOS devices and three-terminal devices which are non-directed graphs. Logically, they are either one-to-one or multi-to-one devices. ESD/Antenna macros are the leaf nodes in SPICE code. XMacro call or NLXM call is a recursive call for further depth traversal in order to reach the leaf node. The XMacros are not leaf nodes. During the traversal, the order of passing net is preferred to be memorized in order to dive into the next level or pop up to the upper level of XMacro.

In the embodiment, the non-directed graphs in the Analog Gate and ESD are converted into an edge of directed graph. The stack is used to store the net during the heuristic search of path finding. If the path is found, the stored net will be popped out and the net on the stack for corresponding path may be cleared (or removed).

The path searching algorithm stops once the destination block DFF is found. However, many paths might exist from the source to destination so a stack is used to store the candidates of multiple paths. Once the path is found, the candidate is popped out from the stack. When all the candidates have gone through, the multiple path finding is done. AMR is used to classify the Analog Gates, ESD/Antenna Protection structures and terminal determination.

In this embodiment, the Analog Gates serve the same functionality as the Logic Gates (INV, NAND, NOR, etc.) except the driving strengths are greatly different. The SPICE code for analog inverter gate (A_INV) is shown as following.

```
.SUBCKT A_INV OUT SUB VDD VSS IN MP=1 LP=0.35U
WP=3.2U ...
MN0 OUT IN VSS SUB N__18__G2 W=WN L=LN M=MN
MP0 OUT IN VDD VDD P__18__G2 W=WP L=LP M=MP
.ENDS A_INV
```

A_INV features one NMOS and one NMOS in parallel. SPICE codes for other similar analog gates may be predicted from the SPICE code.

The ESD/Antenna protection structures are used to provide a reverse diode function and to guard against the antenna effect. These structures can be implemented by MOS or reversed diodes. In this embodiment, two ESD/Antenna protection structures are disclosed, BUS_ESD and XSC_LOCAL, both implemented by MOS transistors.

BUS_ESD and XSC_LOCAL are dummy devices during normal operation. The input signals (I0-I9) are directly transmitted to the output pins (O0-O9) in BUS_ESD. The XSC_LOCAL is an open circuit and ties the output gate parallel.

Two-terminal SPICE devices, such as resistors, diodes, and capacitors, are one-to-one graphs. These devices are not difficult for the path finding algorithm.

MOS devices, three-terminal resistors, and three-terminal diodes are non-directed graphs with 1-to-more diverse path finding. These devices appear in analog gates such as INV gate, NAND gate, NOR gate, and ESD. These three-terminal devices may be embedded into the analog gates. The analog gates are classified by AMR. They are directed graphs, i.e., the input pin may be directly transformed into the output pin.

The Path Finding uses a Macro as a repeat unit. The multi-path searching is shown as following. Each net in the Marco is connected to external inputs. Top-Macro is a special Macro that each net connected to the associated input pin. For a selected net in each Macro (SUBCKT): (1) If the selected net is connected to DFF (destination), the path is found. Stop path finding for the selected net. (2) Push the selected net to the stack. Repeat steps 3-5 until the stack is clear. (3) If stack is not empty, find Analog Gate path. Pop the net out of the stack if destination in Macro found. (4) If stack is not empty, find the devices (MOS, Resistor, Diode, and Capacitor) path. Pop net out of stack if destination in Macro found. (5) If stack is not empty, find the XMacro (XICORE, XIDACB, XIDACR, etc.) path. Pop net out of stack if destination in XMacro found.

The path finding includes the paths from input pins to destination and from clock pin to destination. Further, in the path finding, a Mixed Signal Mode, Multi-path searching and Partial Circuit Extraction (MMPCE) is performed. The mixed signal mode search includes search for resistors, capacitors, diodes, CMOSs, ESD protection structures and XMacros. Stacks are used to store the multiple paths finding. The branch circuit searches may be required for the partial circuit extraction. The partial circuit is taken out of the entire analog IP.

Figure 3:
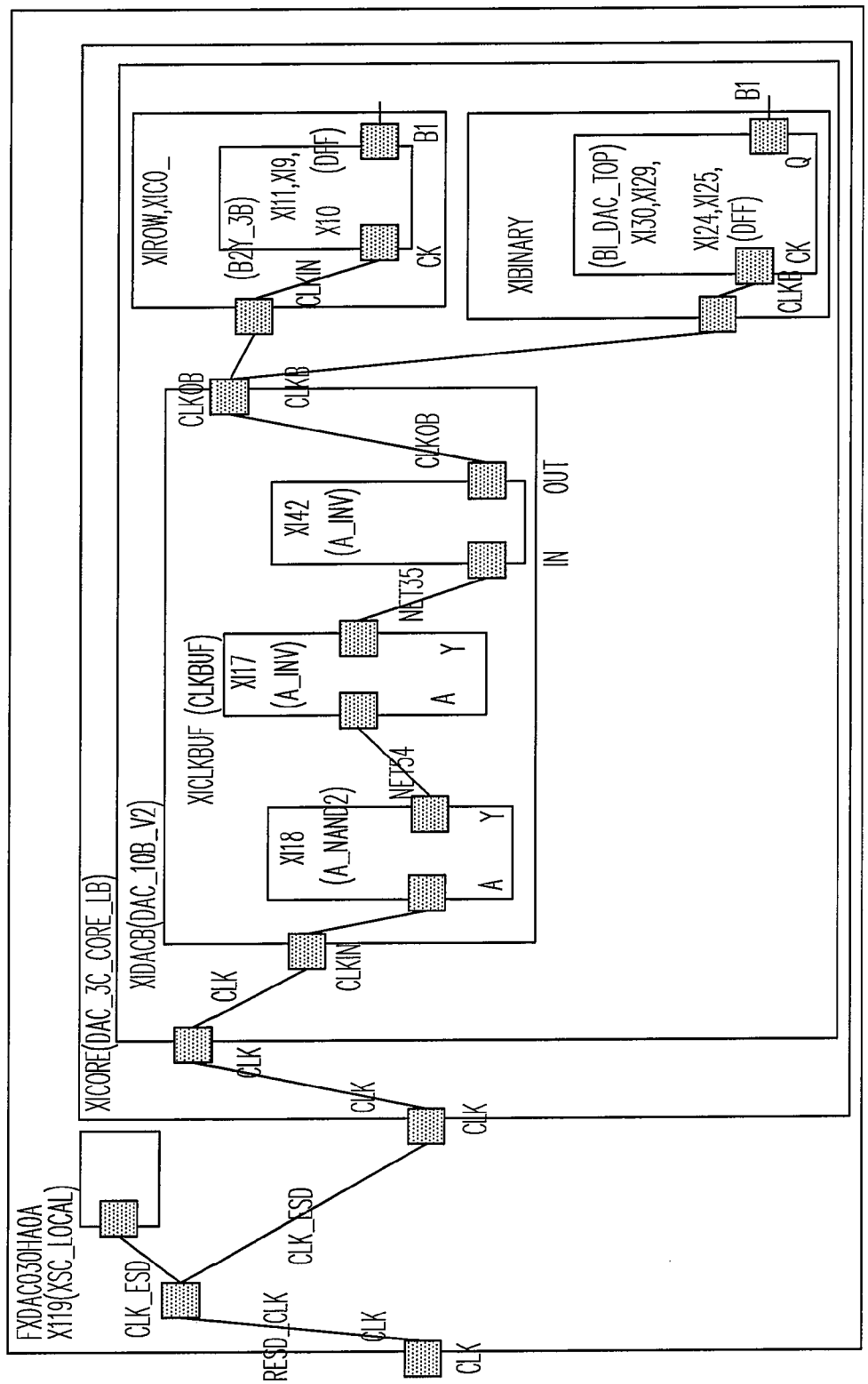
FIG. 3 shows multiple paths for clock (CLK) to DFF.
Figure 4:
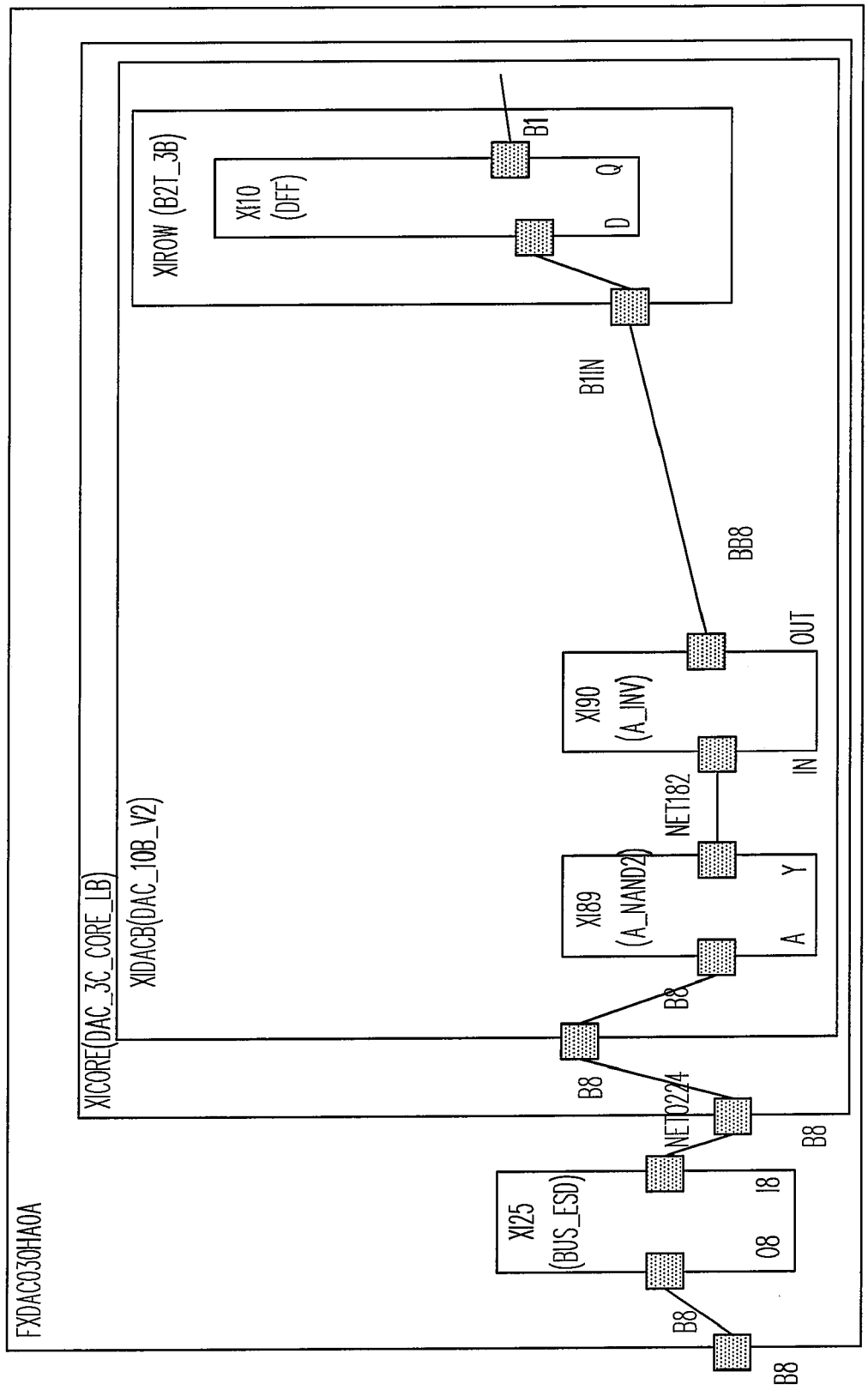
FIG. 4 shows single path for input data (B8) to DFF.

FIG. 3 shows multiple paths from clock (CLK) to DFF and FIG. 4 shows single paths from Input Data (B8) to DFF.

In Step 230 of FIG. 2, the SUBCKT Subset (SCSS) is built. The SUBCKT Subset (SCSS) contains the SUBCKT connected on the source to destination path. SCSS is a subset of entire IPs.

In order to let the signal propagate, the extracted input pin path and clock path that contain the floating net (non-signal net) may be either tied high or tied low.

In Step 240 of FIG. 2, the input pin path, the clock pin path and SCSS are merged. The input pin path and the clock path may traverse different hierarchal paths. Some of the paths may appear in both input pin paths and clock pin path. The duplicated path is preferred to be avoided in the final merged hierarchical netlist.

One example of the merge for SPICE Hierarchical Netlist is shown as following.

```
For each statement in the SCSS:
    1. If the statement either contains NAND Gate or NOR Gate
    statement, then find the associated statement from Input
    Pin Path and Clock Path.
    2. If the statement contains neither NAND Gate nor NOR Gate
    statement, then directly merge the matched statement from Input
    Pin Path and Clock Path.
```

Figure 5:
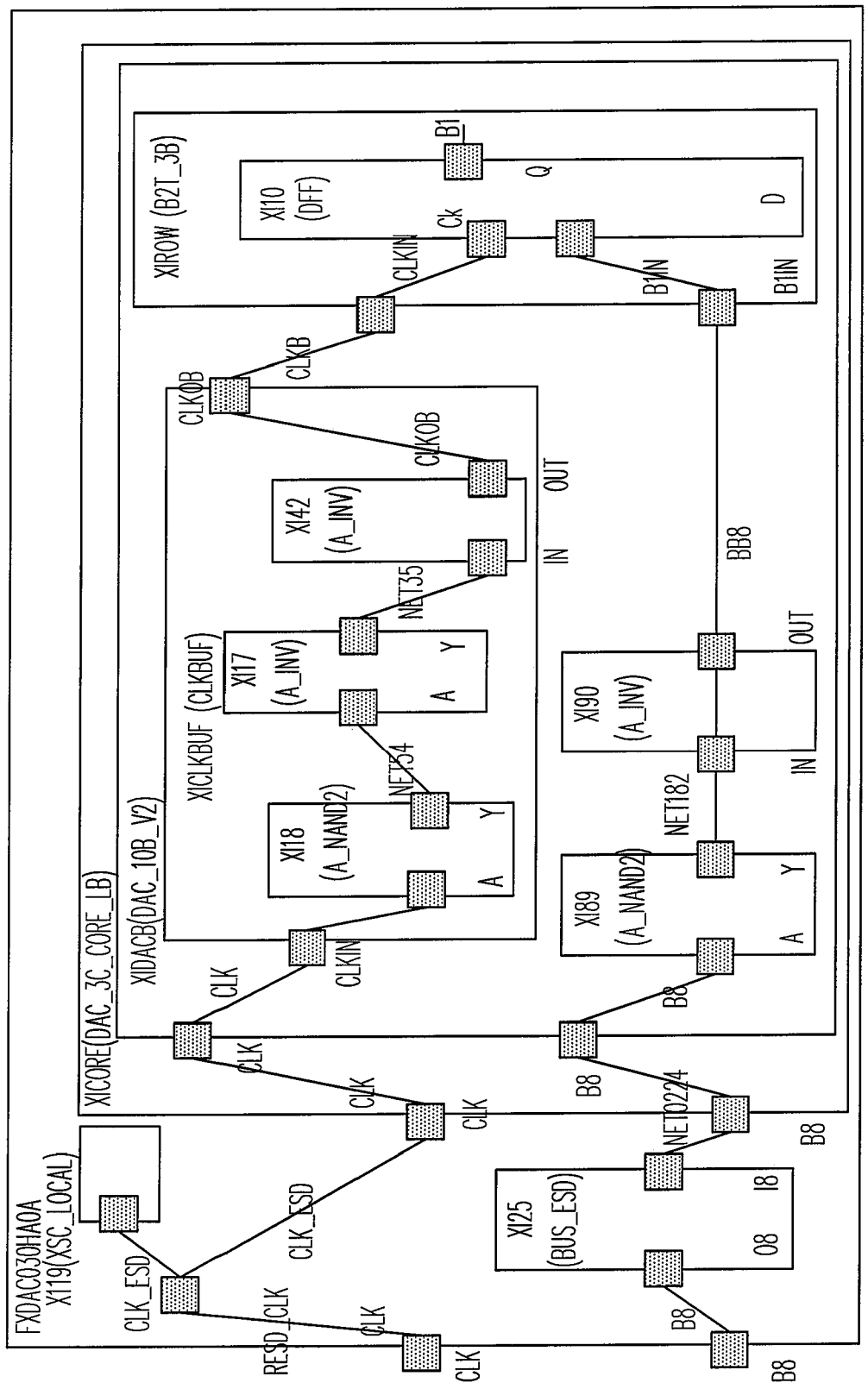
FIG. 5 shows merged paths for clock to DFF and data to DFF.

FIG. 5 shows the merged paths for clock to DFF and for Data to DFF. Further, in merging, the post-simulation parasitic capacitor from the flatten netlist may be attached back to the hierarchical netlist. After the input pin path, the clock pin path and SCSS are merged, the setup/hold time testbench is generated, as shown in Step 250 of FIG. 2.

The Setup/Hold Time characterization includes two steps, i.e., measurement of the delay time and measurement of the setup/hold time. The following shows the input waveform setup for input data and input clock, hierarchical signal measurement, and parameter setup for clock slew rate.

```
1. VB8 B8 0 PWL(0n VP 4N VP 4.001N 0)
2. VCLK CLK 0 PWL(0n VP 1n VP 1.01n 0 6n 0 6.01n VP 9n
   VP '9n+ckslew' 0)
3. .tran 0.005n 30n
4. .measure Tran delay Trig v(CLK) Val = '0.5*(VP)' td = 6n Fall = 1
5. + Targ v(X1.XICORE.XIDACR.XIBINARY.NET156)
   Val = '0.5*(VP)' td = 6n Cross = 1
```

The setup time is the amount of time the synchronous input (D) being stable before the active edge of the clock (CLK). The following shows input data waveform LH and negative clock trigger for setup time measurement.

```
1.  .param delayStart = -1.9n
2.  .param delayRange = 10.1n
3.  .param delayStop = '9n*1.5+delayRange+daslew+ckslew'
4.  .param delaytime = Opt1 (delayStart, delayStart, delayRange)
5.  .param t0 = '9n+daslew+ckslew*0.5+delay-5p'
6.  .param t1 = '9n+daslew+ckslew*0.5+delay+tcDelta'
7.  .param tcDelta = 0.0765n
8.  .PROBE TRAN V
9.  .Options POST=1 NoMod AUTOSTOP GMINDC=1E-10
10. .Options WL NOMOD NOPAGE INGOLD=2
11. VB8 B8 0 PWL(0n 0 '6n+delaytime' 0 '6n+delaytime+daslew' VP)
12. VCLK CLK 0 PWL(0n VP 1n VP 1.01n 0 6n 0 6.01n VP
    '9n+daslew' VP '9n+daslew+ckslew' 0)
13. .tran 0.005n delayStop Sweep Optimize = Opt1 Result = voltout
    Model = OptMod
14. .Measure Tran voltout max
    v(X1.XICORE.XIDACR.XIBINARY.NET156)
    from=t0 t0=t1 Goal = 'VP*0.5'
15. .Measure Tran SetupTime Trig v(B8) Val = '0.500*VP' Rise = 1
16. + Targ v(CLK) Val = '0.500*VP' td = 6n Fall = 1
17. .Model OptMod Opt Itropt=15 Method = Bisection relin=1e-6
```

The hold time is the amount of time that the synchronous input must be stable after the active clock. The following SPICE code shows a hold time measurement.

```
1. VB8 B8 0 PWL(0n 0 0.001N VP '6n+delaytime' VP
   '6n+delaytime+daslew' 0)
2. VCLK CLK 0 PWL(0n VP 1n VP 1.01n 0 6n 0 6.01n VP
   '9n+daslew' VP '9n+daslew+ckslew' 0)
3. .tran 0.005n delayStop Sweep Optimize = Opt1 Result = voltout
   Model = OptMod
4. .Measure Tran voltout min
   v(X1.XICORE.XIDACR.XIBINARY.NET156)
   from=t0 t0=t1 Goal = 'VP*0.5'
5. .Measure Tran HoldTime Trig v(CLK) Val = '0.500*VP'
   td = 6n Fall = 1
6. + Targ v(B8) Val = '0.500*VP' Fall = 1
```

After the setup/hold time SPICE testbench is generated, the setup/hold time SPICE testbench is parallel run, as shown in Step 260. During delay time measurement, the input clock may be defined as positive trigger or negative trigger. The input data waveform may be LH (Low to High) or HL (High to Low). The delay measurement is triggered by the negative trigger clock and measured by Cross command.

Figure 6:
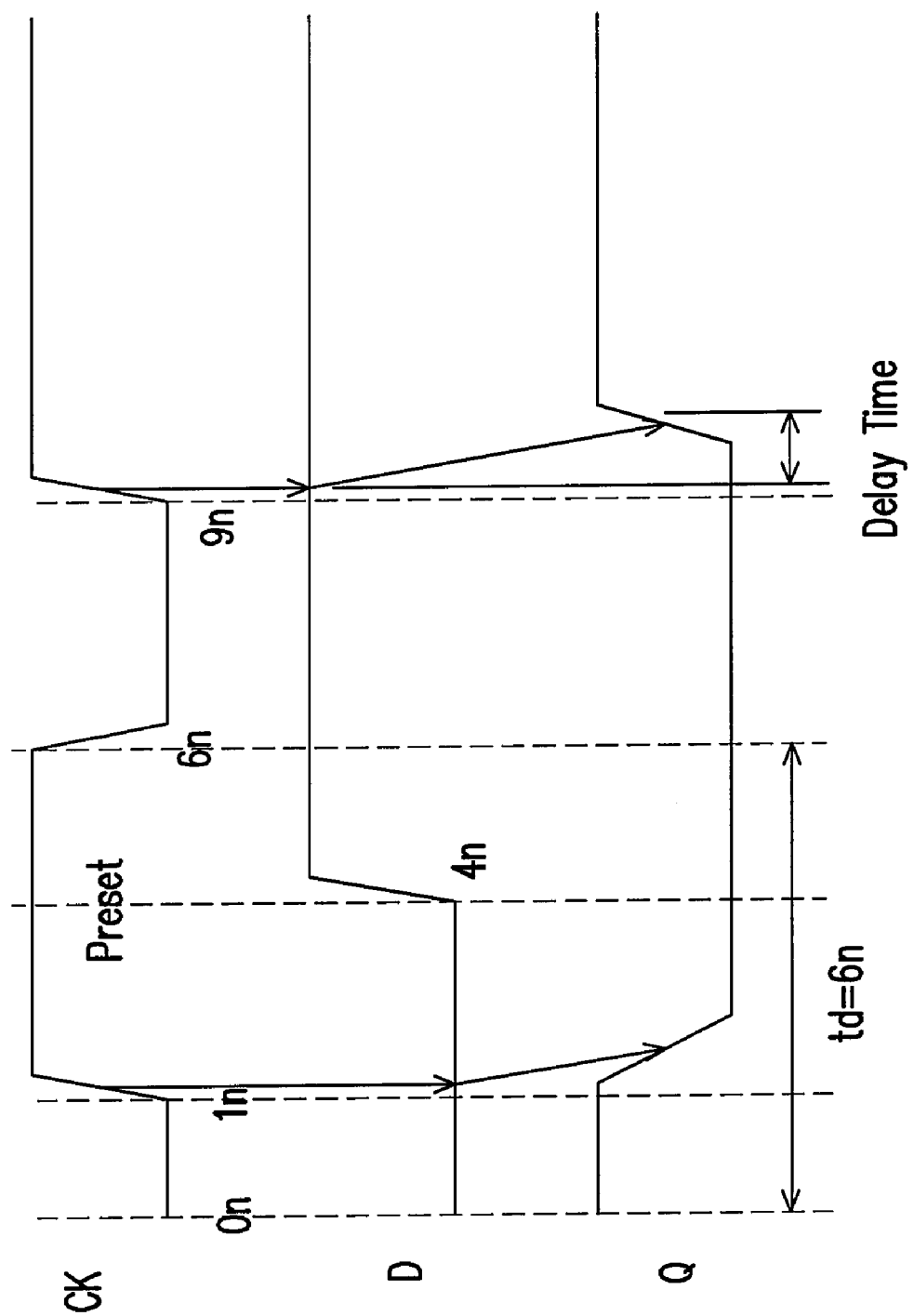
FIG. 6 shows delay time measurement.

There are two trigger modes (positive trigger and negative trigger) for clocks and two input waveforms (LH and HL) for data. Therefore, four combinations for clock and input data waveforms are considered in the delay measurement. FIG. 6 shows one example of the combination: CK (Positive Trigger)/Data (LH). The CK (Positive Trigger)/Data (HL), CK (Negative Trigger)/Data (LH), and CK (Negative Trigger)/Data (HL) of the delay time measurement are similar. In addition, there are three slew rates for clock and three corners (BC, TC, and WC) for processes. The number of delay time results is 2×2×3×3=36. For the 10 input pins (R0-R9, G0-G9, B0-B9), there will be 30×36=1080 test benches.

The input data triggering window is set up by parameter delaytime. The delaytime is determined by the delayStart and delayRange. The trigger window is preferred to be started a safe range after the preset clock signal to avoid sampling of unwanted preset clock. It is also preferred to be a certain period after the approaching/triggering data signal with existing clock signal.

The output measuring window is set up by parameters t0 and t1. The parameter t0 is currently offset by 5 psec. The parameter t1 containing the tcDelta is about 76.5% of the input waveform slope.

Figure 7:
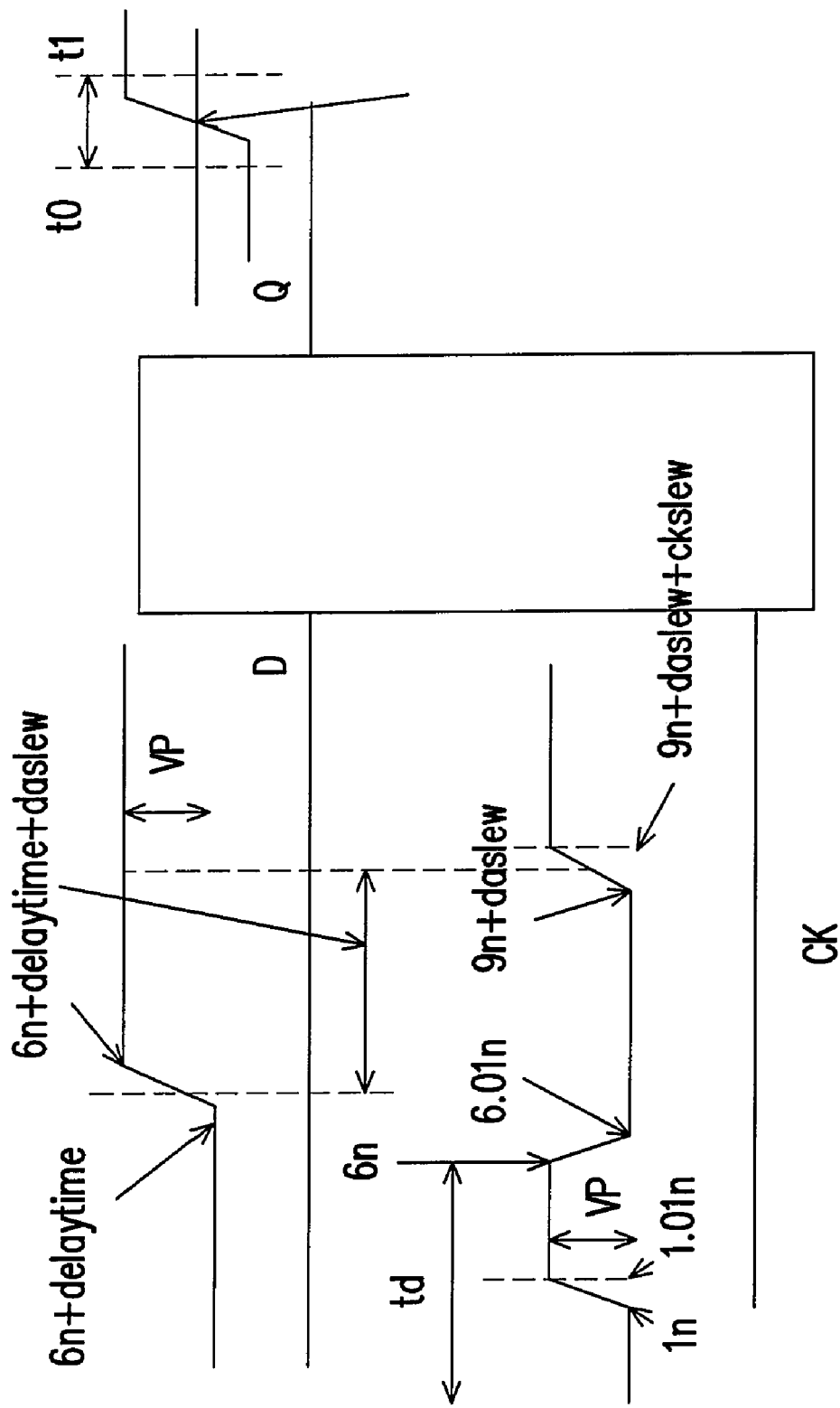
FIG. 7 shows setup time measurement.
Figure 8:
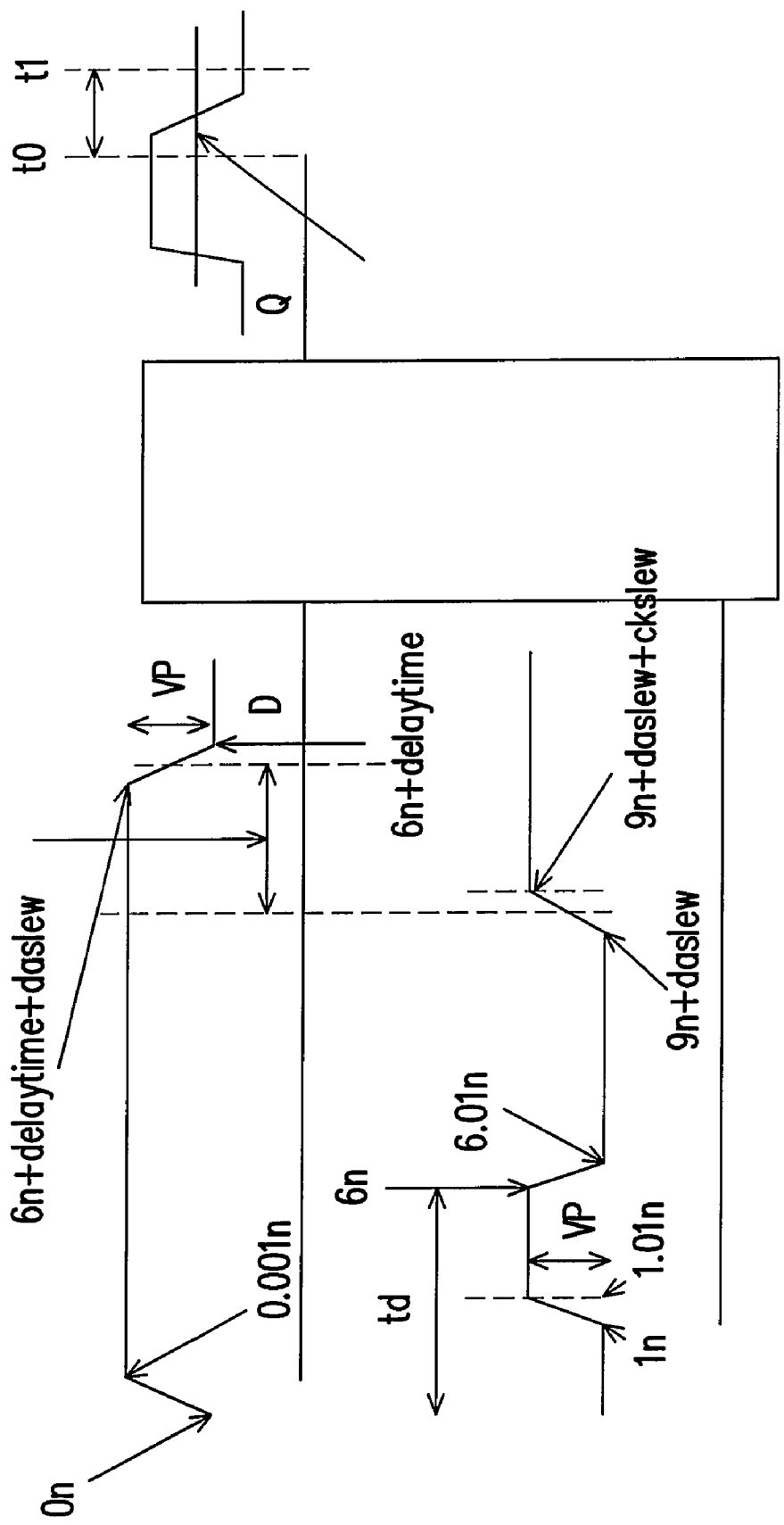
FIG. 8 shows hold time measurement.

The Input Waveform D may be LH or HL and the clock may be triggered by positive or negative. FIG. 7 shows one example of the combination of clock (positive trigger or negative trigger) and Data (LH or HL) during setup time measurement. FIG. 8 shows one example of clock (positive trigger or negative trigger) and Data (LH or HL) during hold time measurement. The following table shows the Run Time and some typical setup/hold time accuracy comparison.

|  | Full IP Hierarchical Netlist | Clock and Input Pin Partial Path of Hierarchical Netlist | Accuracy |
| --- | --- | --- | --- |
| Run time | 2.5 hours | Less than 5 seconds |  |
| Setup Time | 0.56 nsec | 0.55 nsec | 98% |
| Hold Time | 0.45 nsec | 0.44 nsec | 98% |

After parallel run of SPICE testbench, the liberty libraries are generated, as shown in Step 270 of FIG. 2. The following shows the Synopsys (Liberty) setup/hold time example for input pin (R8) vs. Clock (CLK). The negative clock triggers and positive clock triggers for setup and hold time are expressed by "setup_falling" and "hold_falling"; and "setup rising" and "hold_rising", respectively.

```
1.  pin (B8) {
2.    timing ( ) {
3.      related_pin : "CLK";
4.      timing_type : "setup_falling";
5.      rise_constraint ("CONST_3x3") {
6.        index_1("0.020000,1.000000,2.000000");
7.        index_2("0.020000,0.500000,1.000000");
8.        values("-0.004199,-0.188600,-0.287200", \
9.          "0.045800,-0.082910,-0.210800", "0.046780,
            -0.090720,-0.218700");
10.     }
11.     fall_constraint ("CONST_3x3") {
12.       index_1("0.020000,1.000000,2.000000");
13.       index_2("0.020000,0.500000,1.000000");
14.       values("-0.033500,-0.212000,-0.339900", \
15.         "0.101500,-0.071190,-0.158100", "0.178600,0.032320,
            -0.119000");
16.     }
17.   }
18.   timing ( ) {
19.     related_pin : "CLK";
20.     timing_type : "hold_falling";
21.     rise_constraint ("CONST_3x3") {
22.       index_1("0.020000,1.000000,2.000000");
23.       index_2("0.020000,0.500000,1.000000");
24.       values("0.033500,0.212000,0.348700," \
25.         "-0.101500,0.071190,0.196200", "-0.172800,
            -0.032320,0.119000");
26.     }
27.     fall_constraint ("CONST_3x3") {
28.       index_1("0.020000,1.000000,2.000000");
29.       index_2("0.020000,0.500000,1.000000");
30.       values("0.004199,0.188600,0.304800", \
31.         "-0.066310,0.082910,0.210800", "-0.067290,
            0.090720,0.209900");
32.     }
33.   }
34. }
```

The embodiment may be applied to all analog IP with DFF to provide very accurate dynamic/analog time (98%~100%) and clock synchronization.

Figure 9:
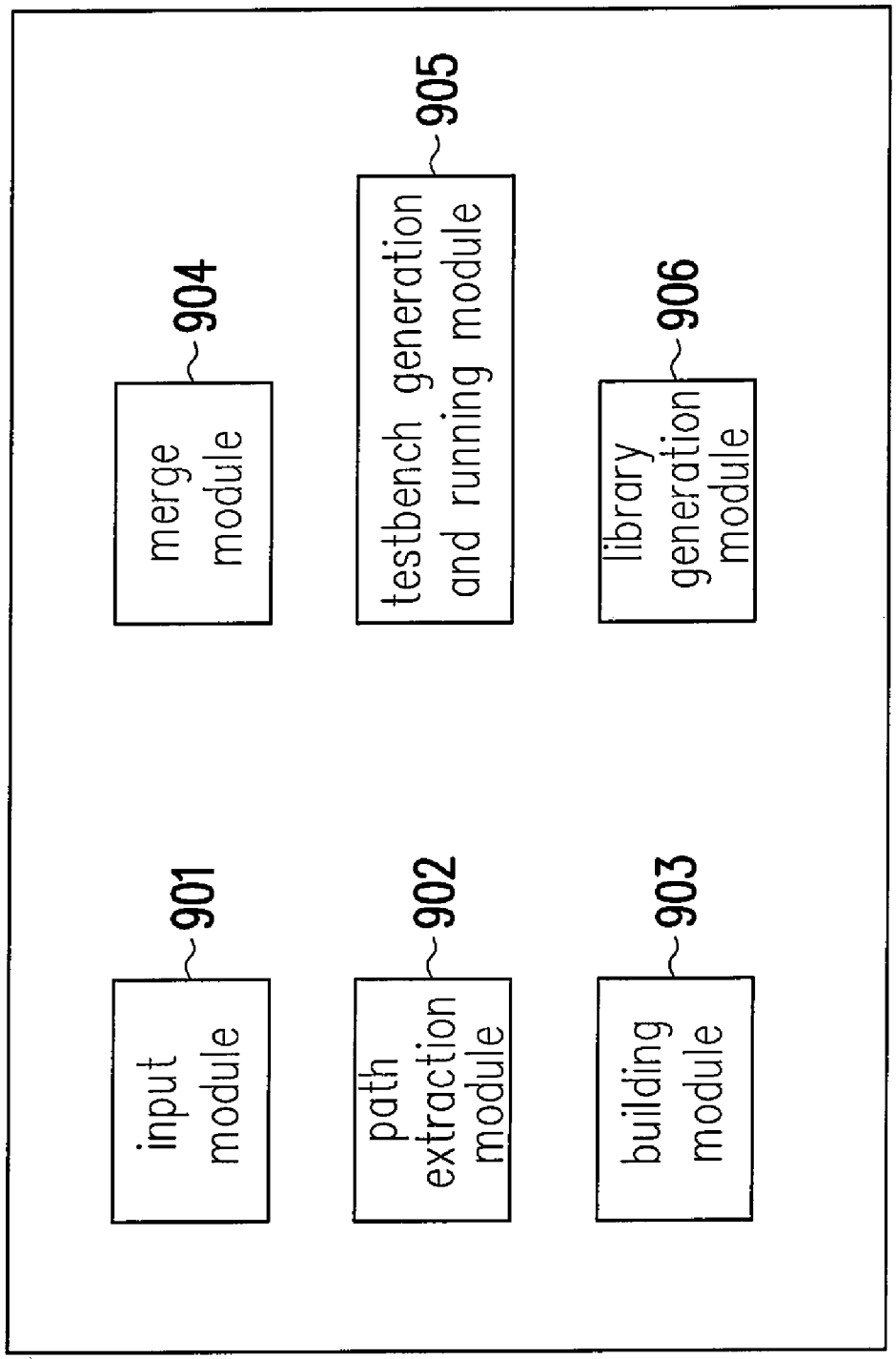
FIG. 9 shows a system for Setup/Hold time characterization according to another embodiment of the invention.

Further, another embodiment of the invention, as shown in FIG. 9, provides a system for setup/hold time characterization for an analog IP including flip-flops of at least first and second levels. The system includes: an input module 901, a path extraction module 902, a building module 903, a merge module 904, a testbench generation and running module 905 and a library generation module 906.

The input module 901 are used for receiving the inputting parameters. The inputting parameters includes data pins, the clock pin and the flip-flop of the first level.

The path extraction module 902 extracts critical paths for setup/hold time simulation. The critical paths includes paths from the data pins to the flip-flop of the first level and paths from the clock pin to the flip-flop of the first level. Further, the path extraction module 902 builds and extracts a hierarchical netlist.

The building module 903 builds a subcircuit subset (SCSS). The path extraction module 902 judges the path is found if a selected net in the SCSS is judged to be connected to the destination block. The path extraction module 902 pushes the selected net to a stack if the selected net in the SCSS is judged to be not connected to the destination block. If the stack is not empty, the path extraction module 902 finds a path for the analog gate; and pops the net out of the stack if destination found. If the stack is not empty, the path extraction module 902 finds a device path; and pops the net out of the stack if destination found. If the stack is not empty, the path extraction module 902 finds a path for the non-leaf nodes; and pops the net out of the stack if destination found. The building module 903 automatically recognizes analog gates, ESD protection structures and non-leaf nodes from the hierarchical netlist. The building module 903 ties logic high or logic low if the extracted data path or the extracted clock path contains a floating net.

The merge module 904 merges the extracted critical paths and the SCSS. The merge module 904 uses the SCSS as a reference hierarchical structure. If a statement in the SCSS contains either a NAND gate statement or a NOR gate statement, the merge module 904 finds the associated statement from the data path and the clock path. If the statement in the SCSS contains neither the NAND gate statement nor the NOR gate statement, the merge module 904 directly merges the matched statement from the data path and the clock path.

The testbench generation and running module 905 generates setup/hold time testbench and parallel runs SPICE testbench. The testbench generation and running module 905 performs a delay time measurement, a setup time measurement and a hold time measurement. The library generation module 906 generates liberty libraries.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for setup/hold time characterization for an analog IP including flip-flops of at least first and second levels, the method comprising steps of:
   inputting parameters by an input module, wherein the parameters comprise characterizations of input pin of the analog IP, clock pin connected to the flip-flops and destination block of the analog IP;
   extracting, by a path extraction module, critical paths from the analog IP for setup/hold time simulation;
   wherein the step of extracting critical paths includes a step of extracting data paths from the input pin of data pins to the flip-flop of the first level and extracting clock paths from the clock pin to the flip-flop of the first level;
   building, by a building module, a subcircuit subset (SCSS);
   merging, by a merge module, the extracted critical paths to the SCSS for generating a merged SCSS;
   generating a setup/hold time testbench according to the merged SCSS and running the setup/hold time testbench by a testbench generation and running module; and
   generating liberty libraries, by a library generation module, according to a result of running the setup/hold time testbench.

2. The method of claim 1, wherein the step of extracting critical paths includes a step of building and extracting a hierarchical netlist.

3. The method of claim 2, wherein the step of building the SCSS includes a step of automatically macro recognizing analog gates, ESD protection structures and non-leaf nodes from the hierarchical netlist.

4. The method of claim 3, wherein the step of extracting critical paths includes steps of:
   judging the path is found if a selected net in the SCSS is judged to be connected to the destination block;
   pushing the selected net to a stack if the selected net in the SCSS is judged to be not connected to the destination block;
   if the stack is not empty, finding a path for the analog gate; and popping the net out of the stack if destination found;
   if the stack is not empty, finding a device path; and popping the net out of the stack if destination found; and
   if the stack is not empty, finding a path for the non-leaf nodes; and popping the net out of the stack if destination found.

5. The method of claim 4, wherein the step of building the SCSS includes a step of tying logic high or logic low if the extracted data path or the extracted clock path contains a floating net.

6. The method of claim 5, wherein the step of merging the extracted critical paths and the SCSS includes steps of:
   using the SCSS as a reference hierarchical structure;
   if a statement in the SCSS contains either a NAND gate statement or a NOR gate statement, finding the associated statement from the data path and the clock path; and
   if the statement in the SCSS contains neither the NAND gate statement nor the NOR gate statement, directly merging the matched statement from the data path and the clock path.

7. The method of claim 6, wherein the step of generating and running the setup/hold time testbench includes steps of:
   performing a delay time measurement;
   performing a setup time measurement; and
   performing a hold time measurement.

8. A system for setup/hold time characterization for an analog IP including flip-flops of at least first and second levels, the system including:
   an input module, for receiving inputting parameters, wherein the parameters comprise input pin of the analog IP, clock pin connected to the flip-flops and destination block of the analog IP;
   a path extraction module, extracting critical paths for setup/hold time characterization;
   wherein the step of extracting critical paths includes a step of extracting data paths from the input pin of data pins to the flip-flop of the first level and extracting clock paths from the clock pin to the flip-flop of the first level;
   a building module, building a subcircuit subset (SCSS);
   a merge module, merging the extracted critical paths to the SCSS for generating a merged SCSS;
   a testbench generation and running module, generating a setup/hold time testbench according to the merged SCSS and parallel running the setup/hold time testbench; and
   a library generation module, generating liberty libraries according to a result of running the setup/hold time testbench.

9. The system of claim 8, wherein the path extraction module further builds and extracts a hierarchical netlist.

10. The system of claim 9, wherein:
   the path extraction module judges the path is found if a selected net in the SCSS is judged to be connected to the destination block;
   the path extraction module pushes the selected net to a stack if the selected net in the SCSS is judged to be not connected to the destination block;
   if the stack is not empty, the path extraction module finds a path for the analog gate; and pops the net out of the stack if destination found;
   if the stack is not empty, the path extraction module finds a device path; and pops the net out of the stack if destination found; and if the stack is not empty, the path extraction module finds a path for the non-leaf nodes; and pops the net out of the stack if destination found.

11. The system of claim 10, wherein the building module automatically recognizes analog gates, ESD protection structures and non-leaf nodes from the hierarchical netlist; and the building module ties logic high or logic low if the extracted data path or the extracted clock path contains a floating net.

12. The system of claim 11, wherein:

the merge module uses the SCSS as a reference hierarchical structure;

if a statement in the SCSS contains either a NAND gate statement or a NOR gate statement, the merge module finds the associated statement from the data path and the clock path; and if the statement in the SCSS contains neither the NAND gate statement nor the NOR gate statement, the merge module directly merges the matched statement from the data path and the clock path.

13. The system of claim 12, wherein the testbench generation and running module performs a delay time measurement, a setup time measurement and a hold time measurement.

* * * * *